(12) United States Patent
Wang

(10) Patent No.: US 10,003,360 B2
(45) Date of Patent: Jun. 19, 2018

(54) DEVICE AND METHOD FOR FINDING ERROR LOCATION

(71) Applicant: MACRONIX INTERNATIONAL CO., LTD., Hsinchu (TW)

(72) Inventor: Kuan Chieh Wang, Taipei (TW)

(73) Assignee: Macronix Internatonal Co., Ltd., Hsinchu (TW)

( * ) Notice: Subject to any disclaimer, the term of this patent is extended or adjusted under 35 U.S.C. 154(b) by 0 days. days.

(21) Appl. No.: 15/283,506

(22) Filed: Oct. 3, 2016

(65) Prior Publication Data

US 2018/0097529 A1 Apr. 5, 2018

(51) Int. Cl.
*H03M 13/00* (2006.01)
*H03M 13/15* (2006.01)

(52) U.S. Cl.
CPC ...... *H03M 13/6502* (2013.01); *H03M 13/152* (2013.01); *H03M 13/1575* (2013.01)

(58) Field of Classification Search
CPC .......... H03M 13/6502; H03M 13/152; H03M 13/1575
See application file for complete search history.

(56) References Cited

U.S. PATENT DOCUMENTS

| | | | |
|---|---|---|---|
| 6,637,002 B1* | 10/2003 | Weng | H03M 13/1545 708/507 |
| 9,166,623 B1* | 10/2015 | Bates | H03M 13/1515 |
| 2015/0331741 A1* | 11/2015 | Park | G06F 11/1004 714/768 |

* cited by examiner

*Primary Examiner* — Sam Rizk
(74) *Attorney, Agent, or Firm* — Finnegan, Henderson, Farabow, Garrett & Dunner LLP

(57) ABSTRACT

An electronic device for finding error locations in a codeword includes a plurality of power control units configured to find error locations in the codeword. The plurality of power control units are coupled in parallel. Each of the plurality of power control units includes a plurality of corresponding input control circuits to individually turn on or off the corresponding power control unit.

18 Claims, 11 Drawing Sheets

DEVICE AND METHOD FOR FINDING ERROR LOCATION

FIELD

Exemplary embodiments relate to an electronic device and method for finding error locations and, more particularly, to a configurable electronic device and method for finding error locations.

BACKGROUND

Bose, Chaudhuri, and Hocquenghem (BCH) codes are a type of error correction codes which are widely used in communication and storage systems. For example, a receiver in a communication system may receive messages that include errors resulting from various operations in transmitting the messages. Also, for example, errors may occur when reading data from a memory system. An error correction method employing BCH codes includes three steps: computing syndromes, finding error locator polynomials, and finding error locations.

Finding error locations is a time-consuming operation. A parallel architecture has been proposed to shorten the search time. But high parallelization can lead to high operation current and high leakage current.

SUMMARY OF EMBODIMENTS

According to a first aspect of the present disclosure, there is provided an electronic device for finding error locations in a codeword. The electronic device includes a plurality of power control units configured to find error locations in the codeword. The plurality of power control units are coupled in parallel. Each of the plurality of power control units includes a plurality of corresponding input control circuits to individually turn on or off the corresponding power control unit.

According to a second aspect of the present disclosure, there is provided a method for finding error locations in a codeword. The method is performed by an electronic device including a controller and a plurality of power control units. The method includes: determining whether the codeword includes one or more errors; if the codeword includes no error, turning off all of the power control units; if the codeword includes one or more errors, determining whether a time to find locations of the one or more errors is shorter than or equal to a predetermined time; if the time is shorter than or equal to the predetermined time, turning on all of the power control units; and if the time is not shorter than or equal to the predetermined time, turning off a portion of the power control units.

According to a third aspect of the present disclosure, there is provided a method for finding error locations in a codeword. The method is performed by an electronic device including a controller and a plurality of power control units. The method includes: determining whether the codeword includes one or more errors; if the codeword includes no error, turning off all of the power control units; if the codeword includes one or more errors, determining whether a time to find locations of the one or more errors is shorter than or equal to a predetermined time; if the time is shorter than or equal to the predetermined time, turning on all of the power control units; if the time is not shorter than or equal to the predetermined time, determining whether the number of the errors in the codeword is greater than or equal to a predetermined threshold; if the number of the errors in the codeword is not greater than or equal to the predetermined threshold, turning on all of the power control units; and if the number of the errors in the codeword is greater than or equal to the predetermined threshold, turning off a portion of power control units.

BRIEF DESCRIPTION OF THE DRAWINGS

Reference will now be made, by way of example, to the accompanying drawings which show example embodiments of the present application, and in which.

DESCRIPTION OF EMBODIMENTS

Hereinafter, embodiments consistent with the present disclosure will be described with reference to the drawings. Wherever possible, the same reference numbers will be used throughout the drawings to refer to the same or like parts.

Figure 1:
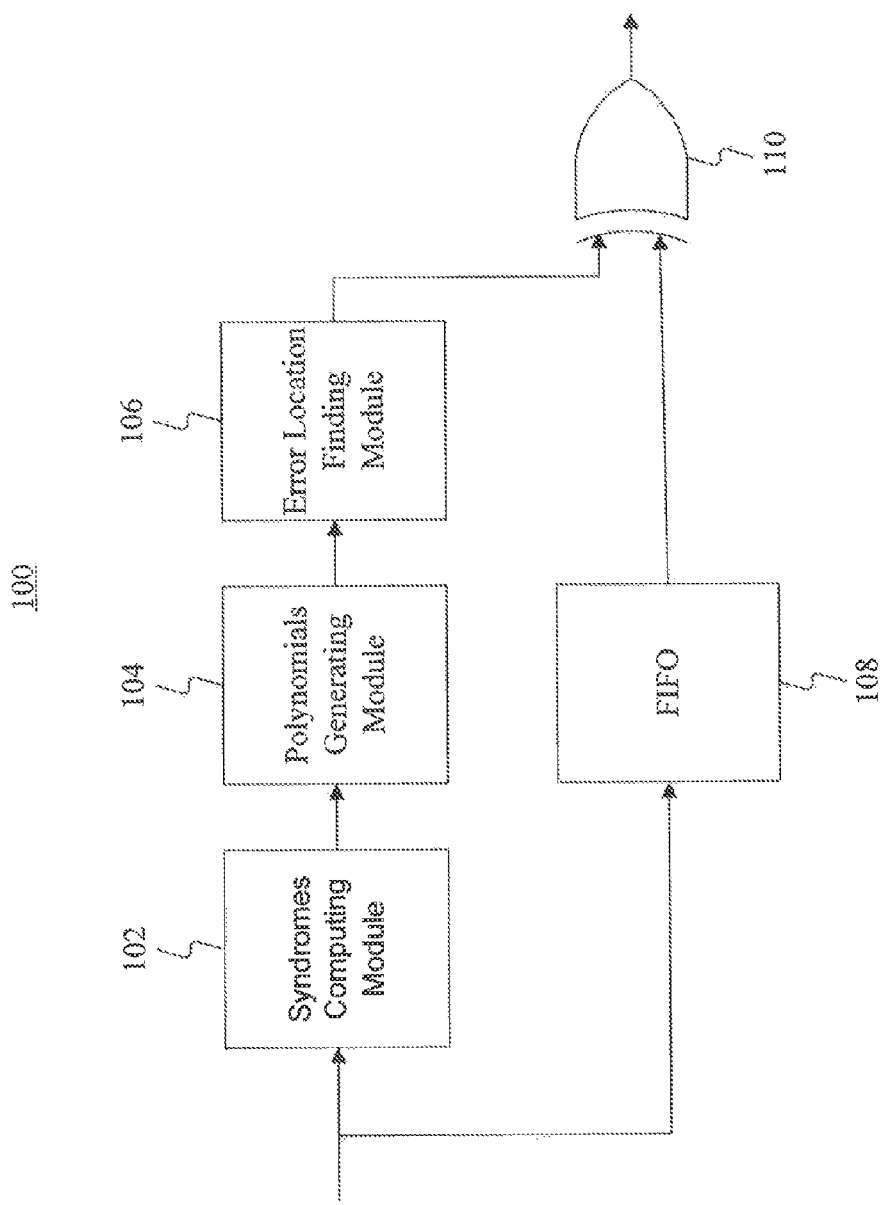
FIG. 1 illustrates a block diagram of a decoder consistent with embodiments of the present disclosure.

FIG. 1 illustrates a block diagram of a decoder 100, such as a BCH decoder, consistent with embodiments of the present disclosure. As shown in FIG. 1, BCH decoder 100 includes a syndromes computing module 102, a polynomials generating module 104, an error location finding module 106, a first-in-first-out (FIFO) module 108, and an XOR operation module 110.

Syndromes computing module 102 and FIFO 108 of BCH decoder 100 are each coupled to receive n bits of a codeword. As used herein, a codeword results from an encoder transforming a message. FIFO 108 is configured to store the received n-bit codeword. Syndromes computing module 102 is configured to compute syndromes from the received n-bit codeword. If the computed syndromes are not all zero, one or more errors are present within the received codeword. Polynomials generating module 104 is coupled to syndromes computing module 102 and configured to generate error locator polynomials from the non-zero syndromes, where a polynomial is in the form of $\wedge(x)=\wedge_t x^t+\wedge_{t-1} x^{t-1}+\ldots+\wedge_0$. ($\wedge \geq 1$ bit), $\wedge_0, \ldots \wedge_{t-1}, \wedge_t$ being polynomial constants. Error location finding module 106 is coupled to polynomials generating module 104 and configured to find error locations in the codeword by finding the roots of the polynomials, the roots of the polynomials representing the error locations. XOR operation module 110 is coupled to FIFO 108 and error location finding module 106 and configured to receive error bits from FIFO module 108 and flip them by an XOR operation to correct the errors. In a binary system, a codeword can be a sequence of 0's and/or 1's. For example, a codeword can be (1 1 0 1 0 0 0). For example and without limitation, an exemplary definition of codeword may be found in "Error Control Coding: Fundamentals and Applications" by Shu Lin et al., $2^{nd}$ Edition.

Figure 2:
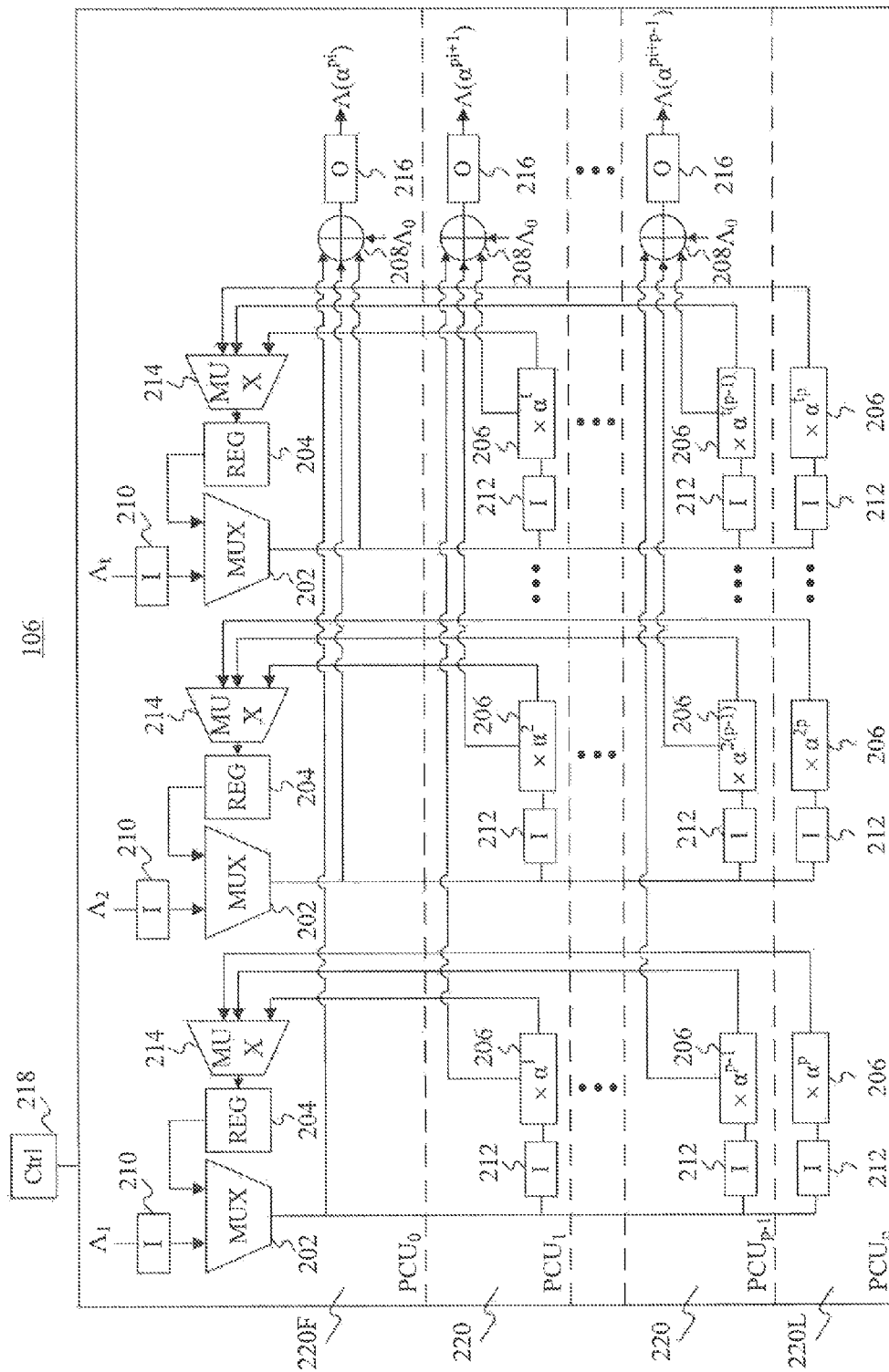
FIG. 2 is a hardware configuration of an error location finding module consistent with embodiments of the present disclosure.

FIG. 2 is an exemplary hardware configuration of error location finding module 106 consistent with embodiments of the present disclosure. Error location finding module 106 includes t first multiplexers 202 (MUX), t registers 204 (REG), and (p×t) calculation units 206, such as multipliers ($\alpha^1, \alpha^2, \ldots \alpha^t; \ldots \alpha^{p-1}, \alpha^{2(p-1)}, \ldots \alpha^{t(p-1)}$; and $\alpha^p, \alpha^{2p}, \ldots \alpha^{tp}$), p adders 208, t first input control units/circuits 210 (I), (p×t) second input control units/circuits 212 (I), t second multiplexers 214 (MUX), p output control units/circuits 216 (O), and a controller (Ctrl) 218 configured to control the components of error location finding module 106, where t is the error correction capability. For example, in a memory controller application, t can be 8 to 72. In a digital video broadcasting standard (DVB-S2), t can be 8 to 12. Controller 218 is coupled to each of first multiplexers 202, registers 204, calculation units 206, adders 208, first input control units/circuits 210, second input control units/circuits 212, second multiplexers 214, and output control units/circuits 216 to provide control signals thereto. Detailed connections between controller 218 and these components shown in FIG. 2 are omitted to facilitate clarity of the illustration of interconnections between the components. In some embodiments, controller 218 is a processor configured to execute instructions to control the components of error location finding module 106.

The components of error location finding module 106 form (p+1) power control units 220F ($PCU_0$), 220 ($PCU_1, \ldots PCU_{p-1}$), and 220L ($PCU_p$). The first power control unit 220F includes t first input control units 210, t first multiplexers 202, t registers 204, t second multiplexers 214, one adder 208, and one output control unit 216. The last power control unit 220L ($PCU_p$) includes t second input control units 212 and t multipliers 206. The other power control units 220 ($PCU_1, \ldots PCU_{p-1}$) include t second input control units 212, t multipliers 206, one adder 208, and one output control unit 216.

Still with reference to FIG. 2, an output of each first input control unit 210 is coupled to a first input of a corresponding first multiplexer 202. An output of each register 204 is coupled to a second input of a corresponding first multiplexer 202. An output of each first multiplexer 202 is coupled to inputs of corresponding second input control units 212, outputs of which are coupled to inputs of corresponding multipliers 206. A first output of each of multipliers 206 is coupled to a corresponding second multiplexer 214. A second output of each of multipliers 206 of power control units 220 ($PCU_1, \ldots PCU_{p-1}$) is coupled to a corresponding adder 208. Each of the multipliers 206 in the last power control unit 220L ($PCU_p$) includes one output coupled to a corresponding second multiplexer 214.

Power control units 220F, 220, and 220L are controlled through first input control units 210 and second input control units 212. In some embodiments, power control units 220F, 220, and 220L are further controlled through output control units 216. In some embodiments, each of power control units 220 can be individually turned on or off. For example, when no errors occur in a data transmission, error location finding module 106 can be turned off. In one embodiment, this can be implemented by controller 218 enabling all of first input control units 210 to turn off all power control units 220. In another embodiment, error location finding module 106 can be turned off by controller 218 enabling all of first input control units 210 and second input control units 212. In yet another embodiment, error location finding module 106 can be turned off by controller 218 enabling all of first input control units 210, second input control units 212, and output control units 216 to save power when no error is present in the codeword. Enabling output control units 216 blocks output from a corresponding power control unit 220F or 220. For example, controller 218 provides a control signal to one of output control units 216 to enable or disable that output control unit 216. When all of first input control units 210, second input control units 212, and output control units 216 are to be enabled, the same control signal can be provided by controller 218 to these components to simplify the control scheme.

When there is sufficient time to search error locations, a portion of power control units 220 can be turned on to search the error locations in a power-saving mode while the remainder of power control units 220 can be turned off to save power. In one embodiment, first and second power control units 220F and 220 ($PCU_0$, $PCU_1$) are turned on and the remainder of power control units 220 are turned off. This can be implemented by controller 218 disabling first input control units 210 and the second input control unit 212 of the second power control unit 220 ($PCU_1$), and enabling second input control units 212 of the remainder of power control units 220. In another embodiment, the output control units 216 of the turned-on power control units 220F and 220 ($PCU_0$, $PCU_1$) can be disabled and the output control units 216 of the turned-off power control units 220 and 220L can be enabled. In some embodiments, the input control unit 210 and the output control unit 216 of the same power control unit 220 are provided with the same control signal to simplify the control scheme.

Consistent with embodiments of the present disclosure, each of power control units 220F, 220, 220L can be individually turned on or off by controller 218, depending on various system considerations, such as the time available to search the error locations or the maximum power provided in the system. For example, when a communication or storage system including error location finding module 106 has a limited time to search error locations but is provided with high power, more power control units 220F, 220, 220L can be turned on to search error locations in parallel in a time-saving mode. In some embodiments, when the power is limited in a system, the system can turn on fewer power control units to save power in a time-saving mode. In one embodiment, controller 218 is configured to turn off a first number of power control units 220F, 220, 220L in a power-saving mode and a second number of power control units 220F, 220, 220L in a time-saving mode. The first number is greater than the second number.

Figure 3:
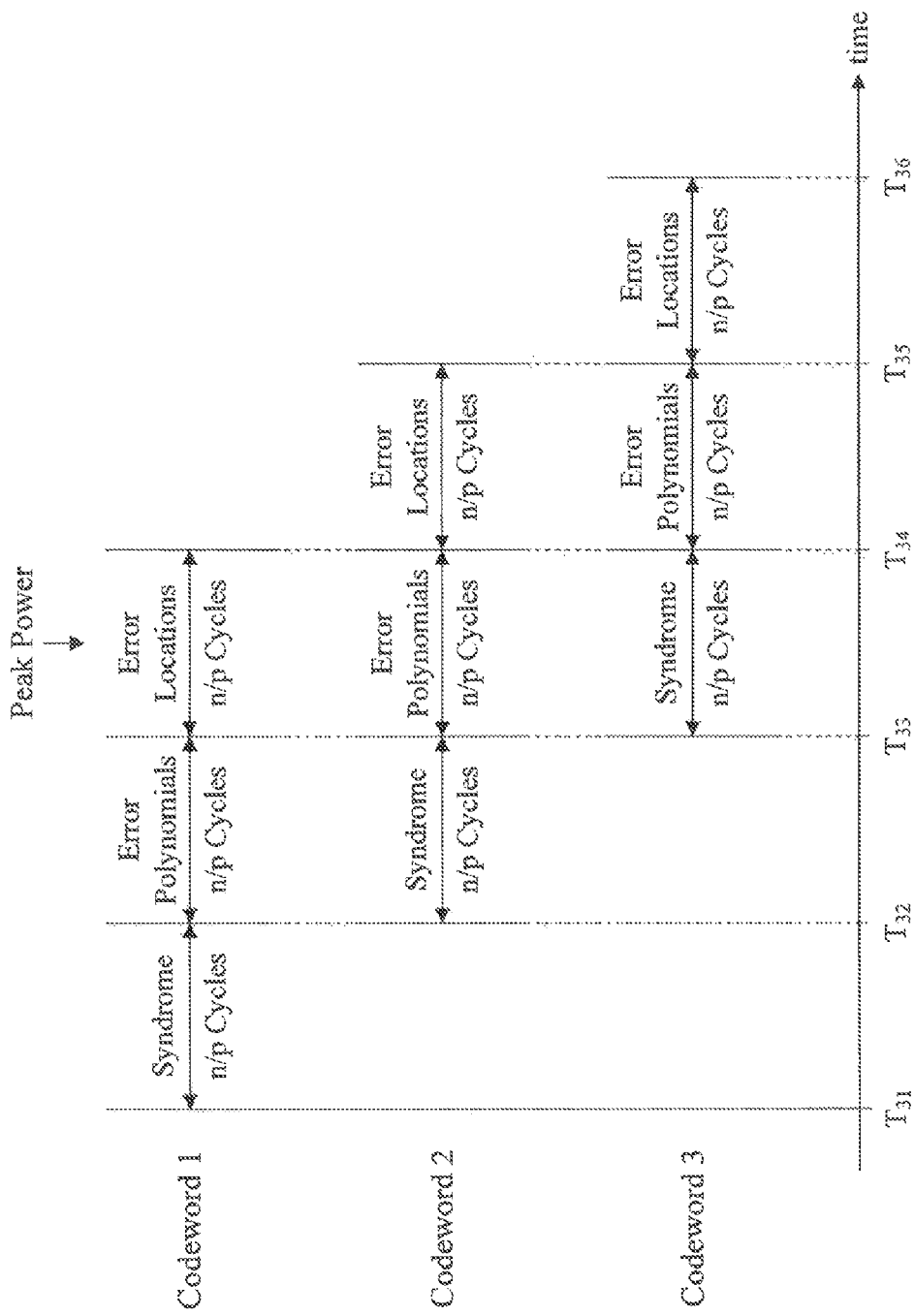
FIG. 3 is a timing diagram showing timings of codewords processed in a BCH decoder consistent with embodiments of the present disclosure.

FIG. 3 is a timing diagram showing timings of three codewords processed in BCH decoder 100, in which all power control units 220F, 220, 220L of error location finding module 106 are turned on. Referring to FIGS. 1-3, at time $T_{31}$, Codeword 1 having n bits is received at BCH decoder 100. From time $T_{31}$ to time $T_{32}$, Codeword 1 is processed by syndromes computing module 102, which can be configured to use n/p clock cycles to compute syndromes for Codeword 1. From time $T_{32}$ to time $T_{33}$, Codeword 1 is processed by polynomials generating module 104, which also can be configured to use n/p clock cycles to generate polynomials for Codeword 1. During the same time period from $T_{32}$ to time $T_{33}$, Codeword 2 having n bits is processed by syndromes computing module 102, which uses n/p clock cycles to compute syndromes for Codeword 2. From time $T_{33}$ to time $T_{34}$, Codeword 1 is processed by error location finding module 106, which uses n/p clock cycles to find the error locations in Codeword 1. During the same time period from $T_{33}$ to time $T_{34}$, Codeword 2 is processed by polynomials generating module 104, which uses n/p clock cycles to generate polynomials for Codeword 2, and Codeword 3 having n bits is processed by syndromes computing module 102, which uses n/p clock cycles to compute syndromes for Codeword 3. From time $T_{34}$ to time $T_{35}$, Codeword 2 is processed by error location finding module 106, which uses n/p clock cycles to find the error locations in Codeword 2. During the same time period from $T_{34}$ to time $T_{35}$, Codeword 3 is processed by polynomials generating module 104, which uses n/p clock cycles to generate polynomials for Codeword 3. From time $T_{35}$ to time $T_{36}$, Codeword 3 is processed by error location finding module 106, which uses n/p clock cycles to find the error locations in Codeword 3. The total time used to process three codewords is 5*n/p clock cycles. The peak power required for BCH decoder 100 to process three codewords occurs between time $T_{33}$ and time $T_{34}$ when all three modules 102, 104, and 106 are activated to work.

Figure 4:
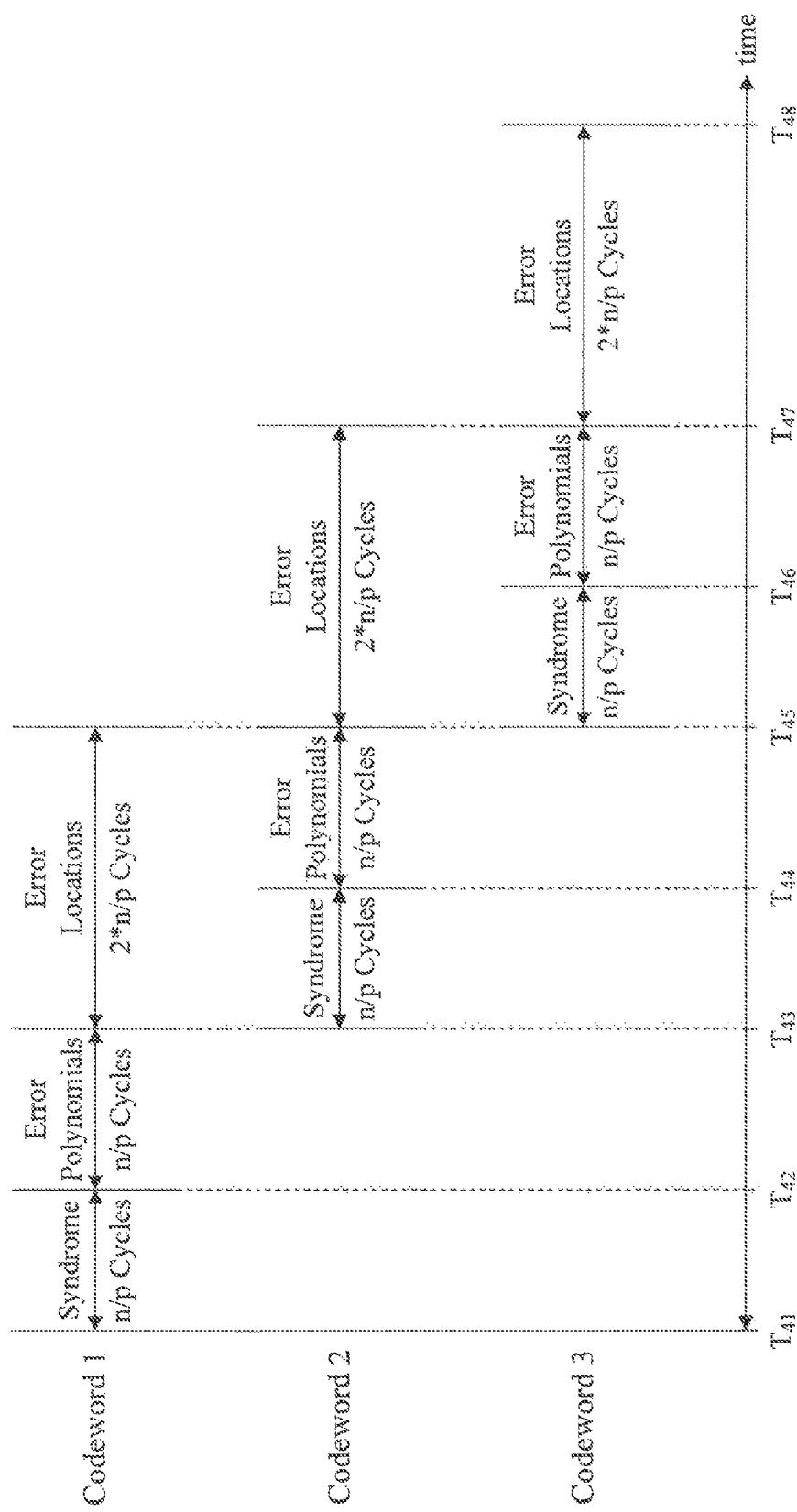
FIG. 4 is a timing diagram showing timings of codewords processed in a BCH decoder consistent with embodiments of the present disclosure.

FIG. 4 is a timing diagram showing timings of three codewords processed in BCH decoder 100, in which one half of power control units 220F, 220, and 220L of error location finding module 106 are turned on. Referring to FIGS. 1, 2, and 4, at time $T_{41}$, Codeword 1 having n bits is received at BCH decoder 100. From time $T_{41}$ to time $T_{42}$, Codeword 1 is processed by syndromes computing module 102, which uses n/p clock cycles to compute syndromes for Codeword 1. From time $T_{42}$ to time $T_{43}$, Codeword 1 is processed by polynomials generating module 104, which uses n/p clock cycles to generate polynomials for Codeword 1. From time $T_{43}$ to time $T_{45}$, Codeword 1 is processed by error location finding module 106, which uses 2*n/p clock cycles to find the error locations in Codeword 1, because one half of power control units 220F, 220, and 220L of error location finding module 106 are turned on, while another half are turned off.

During the same time period from time $T_{43}$ to time $T_{45}$, Codeword 2 having n bits is processed by syndromes computing module 102, which uses n/p clock cycles to compute syndromes for Codeword 2 from time $T_{43}$ to time $T_{44}$, and processed by polynomials generating module 104, which uses n/p clock cycles to generate polynomials for Codeword 2 from time $T_{44}$ to time $T_{45}$. From time $T_{45}$ to time $T_{47}$, Codeword 2 is processed by error location finding module 106, which uses 2*n/p clock cycles to find the error locations in Codeword 2. During the same time period from time $T_{45}$ to time $T_{47}$, Codeword 3 having n bits is processed by syndromes computing module 102, which uses n/p clock cycles to compute syndromes for Codeword 3 from time $T_{45}$ to time $T_{46}$, and then processed by polynomials generating module 104, which uses n/p clock cycles to generate polynomials for Codeword 3 from time $T_{46}$ to time $T_{47}$. From time $T_{47}$ to time $T_{48}$, Codeword 3 is processed by error location finding module 106, which uses 2*n/p clock cycles to find the error locations in Codeword 3. The total time used to process three codewords is 8*n/p clock cycles. The peak power required for BCH decoder 100 to process three codewords occurs from time $T_{43}$ to time $T_{47}$ when two of the three modules 102, 104, and 106 are activated to operate at the same time. The processing time shown in FIG. 4, when one half of power control units 220F, 220, and 220L of error location finding module 106 are turned on, is longer that in FIG. 3, when all of power control units 220F, 220, and 220L of error location finding module 106 are turned on. However, the device configuration corresponding to FIG. 4 uses less power than that corresponding to FIG. 3.

Consistent with embodiments of the present disclosure, when processing speed is a concern, that is, when the processing is to be conducted in a relatively shorter period of time, BCH decoder 100 can be configured so that more power control units 220 of error location finding module 106 are turned on to process codewords in parallel to save time. Further, when power consumption is a concern, BCH decoder 100 can be configured so that fewer power control units 220 of error location finding module 106 are turned on to process codewords to save power.

Figure 5:
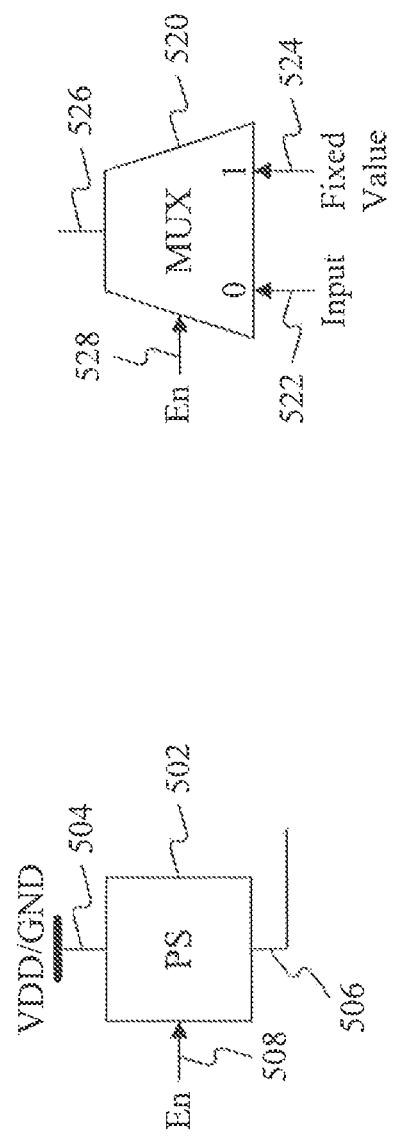
FIG. 5A illustrates an input control circuit consistent with embodiments of present disclosure.
FIG. 5B illustrates another input control circuit consistent with embodiments of present disclosure.

Referring again to FIG. 2, first input control units 210 and second input control units 212 can each be implemented by at least a power switch cell (PS) or a combinational logic cell/circuit, such as a multiplexer (MUX), an AND gate, an OR gate, a NAND gate, an XOR gate, an XNOR gate, or a NOR gate, etc., or other electronic components known by those of ordinary skill in the art. FIG. 5A illustrates an exemplary power switch cell 502 consistent with embodiments of present disclosure. Power switch cell 502 includes a VDD/GND port 504 for coupling to a power source, a power output port 506 for coupling to a power control unit, such as power control unit 220, and a control signal input port 508 to receive a control signal (EN) from a controller, such as controller 218 in FIG. 2. FIG. 5B illustrates an exemplary multiplexer 520 as another structure of first input control units 210 or second input control units 212. In some embodiments, first input control units 210 and second input control units 212 can both be a combinational logic cell/circuit, such as multiplexer 520. Multiplexer 520 includes a first input port 522 configured to receive an input value, a second input port 524 configured to receive a fixed value, an output port 526, and a control signal input port 528 to receive a control signal (EN) from a controller, such as controller 218 in FIG. 2.

Figure 6:
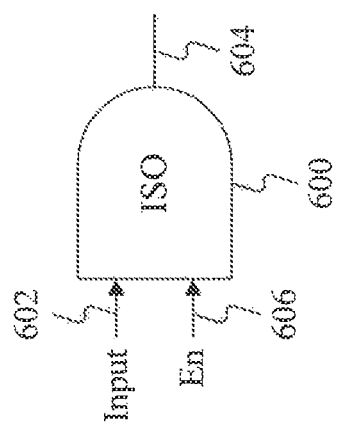
FIG. 6 illustrates an output control circuit consistent with embodiments of present disclosure.

Referring to FIG. 2 again, output control units 216 can be provided as at least an isolation cell/circuit (ISO) or a combinational logic cell/circuit, such as a multiplexer (MUX), an AND gate, an OR gate, a NAND gate, an XOR gate, an XNOR gate, or a NOR gate, etc., or other electronic components known by those of ordinary skill in the art. FIG. 6 illustrates an exemplary isolation cell 600 including an input port 602, an output port 604, and a control signal input port 606 to receive a control signal (EN) from a controller, such as controller 218. A combinational logic cell/circuit provided as output control units 216 is similar to a combinational logic cell/circuit provided as first input control units 210 or second input control units 212. An example of a combinational logic cell/circuit is illustrated in FIG. 5B, and will not be repeated herein.

Figure 7:
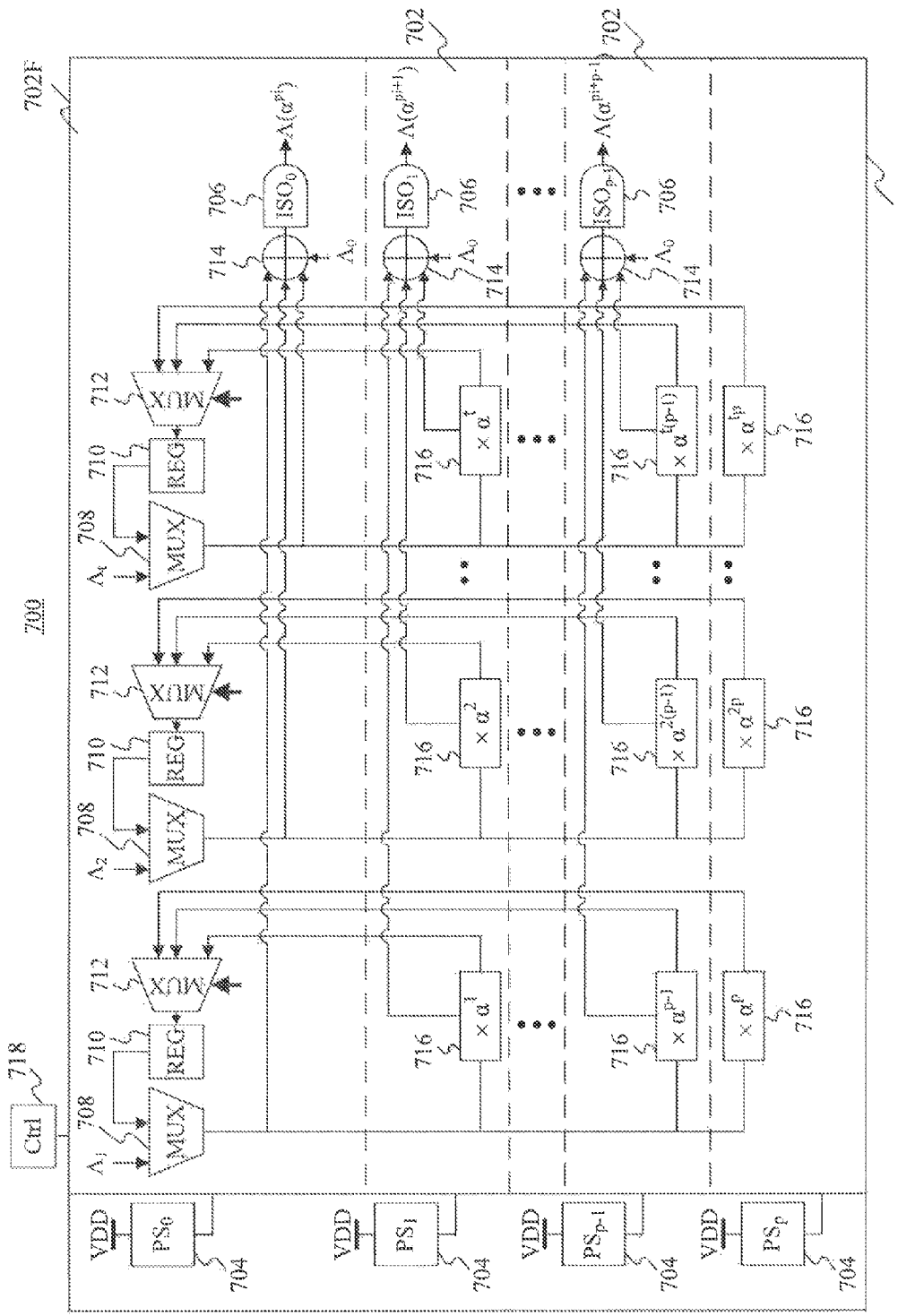
FIG. 7 is a hardware configuration of another error location finding module consistent with embodiments of the present disclosure.

FIG. 7 is an exemplary hardware configuration of another error location finding module 700 consistent with embodiments of the present disclosure. Error location finding module 700 includes a first power control unit 702F, a last power control unit 702L, and (p−1) power control units 702 therebetween. Each of power control units 702F, 702L, and 702 includes a power switch ($PS_x$) 704 as an input control unit to control power provided to a corresponding power control unit 702F, 702L, or 702. Each of power control units 702F and 702 further includes an isolation cell 706 as an output control unit to prevent current leaking from its corresponding power control unit 702F or 702. The first power control unit 702F further includes t first multiplexers (MUX) 708, t registers (REG) 710, t second multiplexers (MUX) 712, and an adder 714. The last power control unit 702L further includes t multipliers 716. Each of power control units 702 further includes t multipliers 716 and an adder 714. First multiplexers 708 receive polynomial constants $\Lambda_1$, $\Lambda_2$, ... $\Lambda_t$. The outputs of first multiplexers 708 are coupled to p corresponding multipliers 716. Each of multipliers 716 of power control units 702 includes an output coupled to a corresponding adder 714 and an output coupled to a corresponding second multiplexer 712. Each of multipliers 716 of power control unit 702L includes an output coupled to a corresponding second multiplexer 712. Second multiplexers 712 are configured to select a value from multipliers 716 for use in a next round of searching error locations. An output of each second multiplexer 712 is coupled to a corresponding register 710. Registers 710 are configured to store the value supplied by second multiplexer 712. An output of each register 710 is coupled to a corresponding first multiplexer 708. An output of each adder 714 is coupled to a corresponding isolation cell 706. Error location finding module 700 further includes a controller (Ctrl) 718 coupled to each of the above components and configured to provide control signals to the above components. Detailed connections between controller 718 and the other components shown in FIG. 7 are omitted to facilitate clarity of illustration of interconnections between the components. In some embodiments, controller 718 is a processor configured to execute instructions to control the components of error location finding module 700.

In the illustrated embodiment, each power control unit 702F, 702, or 702L can be individually controlled by a corresponding power switch cell 704. In some embodiments, some or all of power control units 702F, 702, and 702L can be turned on by controller 718 of error location finding module 700, to increase the speed to search error locations in the codewords. If a low power operation is desired, some of the power control units 702 and 702L can be turned off by cutting the power supply at power switch cells 704 to reduce power consumption. If it is determined that no errors occur in the codewords, all of power control units 702F, 702, and 702L can be turned off to further reduce power consumption. In some embodiments, when a power switch cell 704 is controlled to cut off power supply to a corresponding power control unit 702F, 702, or 702L, an isolation cell 706 of the power control unit is activated to prevent leakage current flowing from the turned-off power control unit. In some embodiments, a power switch cell 704 and an isolation cell 706 of the same power control unit 702 are provided with the same control signal from controller 718 to simplify the control scheme.

Figure 8:
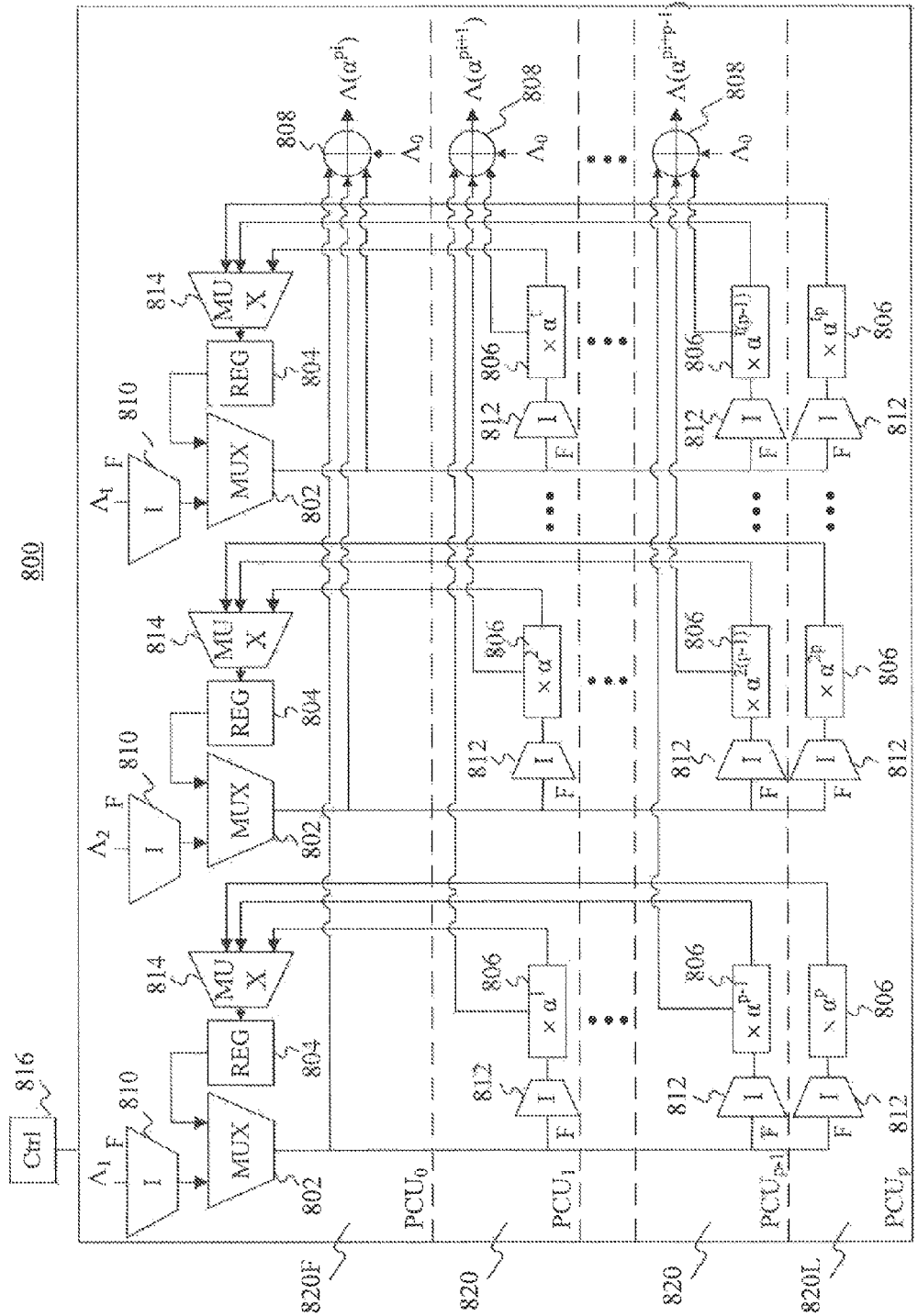
FIG. 8 is a hardware configuration of another error location finding module consistent with embodiments of the present disclosure.

FIG. 8 is an exemplary hardware configuration of another error location finding module 800 consistent with embodiments of the present disclosure. Error location finding module 800 includes t first multiplexers 802 (MUX), t registers 804 (REG), (p×t) multipliers 806 ($\alpha^1, \alpha^2, \ldots \alpha^t; \ldots \alpha^{p-1}, \alpha^{2(p-1)}, \ldots \alpha^{t(p-1)};$ and $\alpha^p, \alpha^{2p}, \ldots \alpha^{tp}$), p adders 808, t first combinational logic cells 810 as first input control units (I), (p×t) second combinational logic cells 812 as second input control units (I), and t second multiplexers 814. These components of error location finding module 800 form (p+1) power control units 820F, 820, and 820L ($PCU_0$, $PCU_1$, ... $PCU_{p-1}$, $PCU_p$). The first power control unit ($PCU_0$) 820F includes t first combinational logic cells 810, t first multiplexers 802, t registers 804, t second multiplexers (MUX) 814, and an adder 808. The last power control unit ($PCU_p$) 820L includes t second combinational logic cells 812 and t multipliers 806. Each of the other power control units 820 ($PCU_1$, ... $PCU_{p-1}$) includes t second combinational logic cells 812, t multipliers 806, and an adder 808. Error location finding module 800 further includes a controller 816 configured to provide control signals to the above components. In some embodiments, controller 816 is a processor configured to execute instructions to control the components of error location finding module 800.

In the illustrated embodiment, first combinational logic cells 810 and second combinational logic cells 812 are third and fourth multiplexers, respectively, that receive a fixed value (F) as an input. In some embodiments, first combinational logic cells 810 and second combinational logic cells 812 can be other combinational logic cells, such as an AND, OR, NAND, or NOR gate. Third multiplexers 810 receive polynomial constants $\Lambda_1$, $\Lambda_2$, ... $\Lambda_t$ as another input, and are controlled by a control signal (EN, FIG. 5A) provided by controller 816 to select either the polynomial constants or the fixed value. For example, when no error occurs in the codeword(s), third multiplexers 810 and fourth multiplexers 812 are controlled to select the fixed value so that power control units 820F, 820, and 820L are operated in a very low power mode. In some embodiments, first power control unit 820F and a portion of the power control units 820 are activated to find error locations in a codeword, while the remainder of the power control units 820, 820L are controlled to run in a low power mode. This is implemented when third multiplexers 810 are controlled to select polynomial constants $\Lambda_1$, $\Lambda_2$, ... $\Lambda_t$ and a portion of fourth multiplexers 812 are controlled to select the value supplied from first multiplexers 802, while the remainder of fourth multiplexers 812 are controlled to select the fixed value. For example, the fixed value can be logic high or logic low, e.g., 1 or 0. If it is desired to find error locations with low power consumption, more power control units 820 and 820L can be controller to select the fixed value. If it is desired to find error locations with high speed, fewer or no power control units 820 and 820L can be controlled to select the fixed value.

In the illustrated embodiment, an output of third multiplexer 810 is coupled to a first input of a corresponding first multiplexer 802. An output of registers 804 is coupled to a second input of a corresponding first multiplexer 802. An output of first multiplexer 802 is coupled to inputs of corresponding fourth multiplexers 812 and adder 808 of the first power control unit 820F. An output of fourth multiplexer 812 is coupled to an input of a corresponding multiplier 806. A first output of each of multipliers 806 is coupled to a corresponding second multiplexer 814. A second output of each of multipliers 806 of power control units 820 ($PCU_1$, ... $PCU_{p-1}$) is coupled to a corresponding adder 808. Each of the multipliers 806 in the last power control unit ($PCU_p$) 820L includes one output coupled to a corresponding second multiplexer 814.

In some embodiments, each of adders 208, 708, and 808 performs an XOR operation on all bits it receives with no carry.

Figure 9:
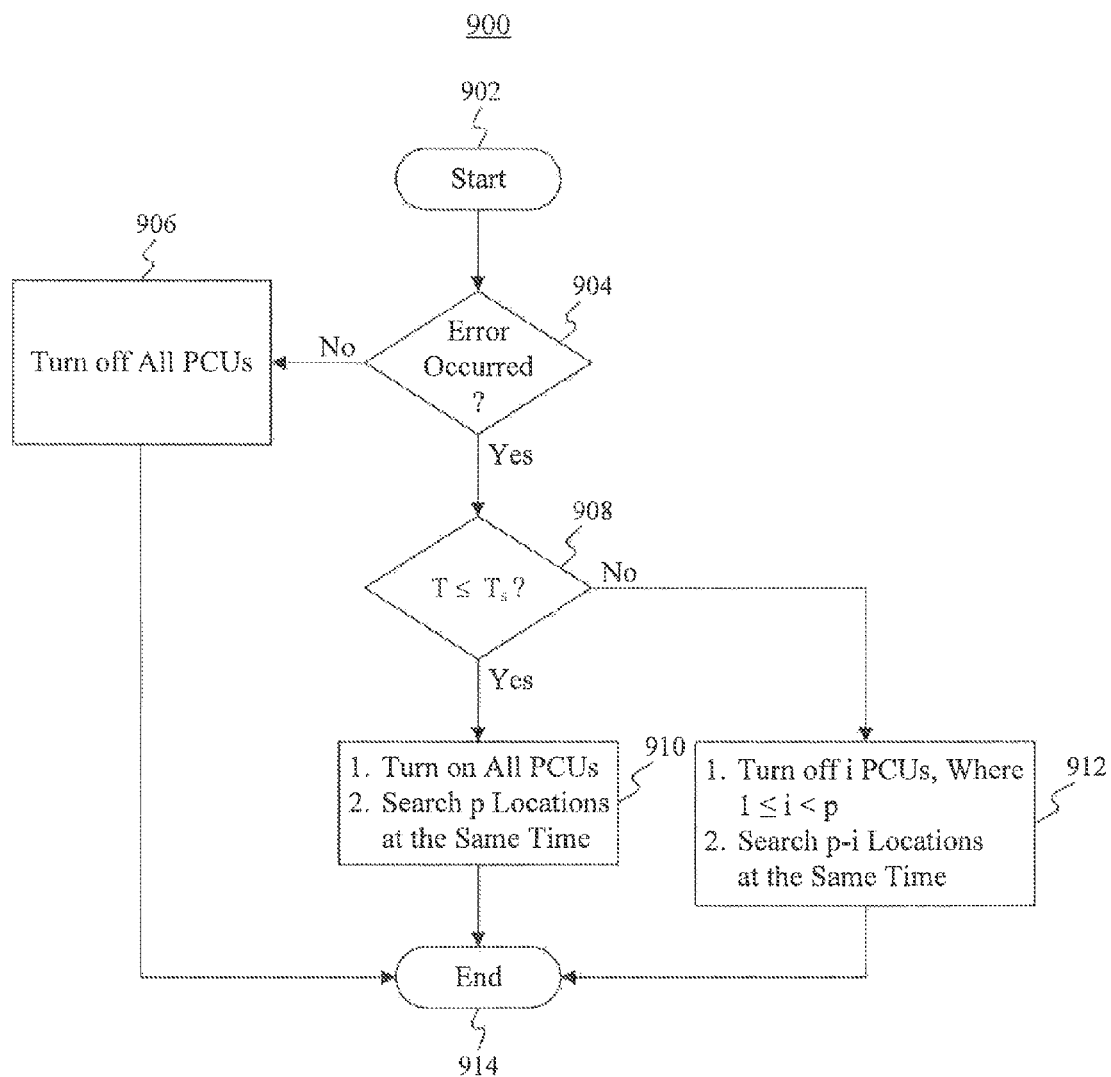
FIG. 9 is a flow chart illustrating a method for finding error locations consistent with embodiments of the present disclosure.

FIG. 9 is a flow chart illustrating a method 900 for finding error locations in one or more codewords, consistent with embodiments of the present disclosure. Method 900 may be executed by an error location finding module, such as error location finding module 106 shown in FIG. 2. Referring to FIGS. 2 and 9, method 900 begins at step 902. In step 904, controller 218 detects whether one or more errors occur in the one or more codewords. If no error occurs, in step 906, all power control units, such as power control units 220, are turned off by controller 218 to save power. If one or more errors are detected in the one or more codewords, in step 908, the controller 218 determines whether it is desired to find the error locations in a time T shorter than or equal to a predetermined time $T_s$. For example, controller 218 determines that the time T to find the error locations needs to be shorter than or equal to the predetermined time $T_s$. If $T \leq T_s$, in step 910, all power control units are turned on to search the error locations. For example, when all power control units 220 in FIG. 2 are turned on, p locations can be searched at the same time.

If it is determined that the processing time to find the error locations is not a concern, in step 912, a portion of the power control units 220 are turned on and the remainder of power control units 220 are turned off, depending on the available time to find error locations. For example, i power control units 220 in FIG. 2 are turned off, where $1 \leq i \leq p$, so that p minus i locations are searched at the same time. Following step 906, 910, or 912, the method 900 ends at step 914.

Figure 10:
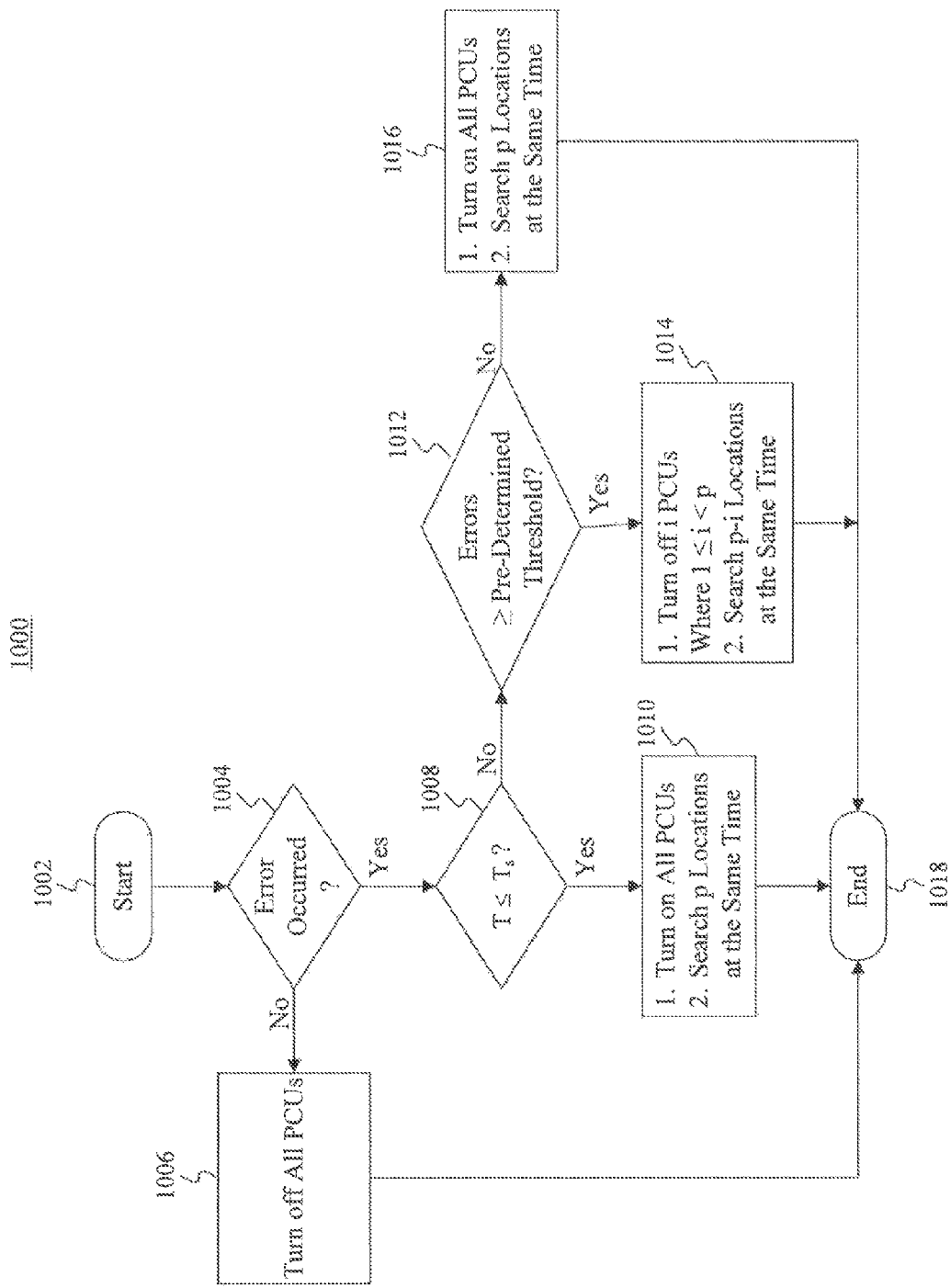
FIG. 10 is a flow chart illustrating another method for finding error locations consistent with embodiments of the present disclosure.

FIG. 10 is a flow chart illustrating another method 1000 for finding error locations in one or more codewords, consistent with embodiments of the present disclosure. Method 1000 may be executed by an error location finding module, such as error location finding module 106 shown in FIG. 2. Referring to FIGS. 2 and 10, method 1000 begins at step 1002. In step 1004, controller 218 detects whether one or more errors occur in the one or more codewords. If no error occurs, in step 1006, all power control units, such as power control units 220, are turned off by controller 218 to save power. If one or more errors are detected in the one or more codewords, in step 1008, controller 218 determines whether it is desired to find the error locations in a time T shorter than or equal to a predetermined time $T_s$. If $T \leq T_s$, in step 1010, all power control units are turned on to search the error locations. For example, when all power control units 220 in FIG. 2 are turned on, p locations can be search at the same time. If it is determined that the time used to find the error locations is not a concern, in step 1012, controller 218 determines whether the number of errors is greater than or equal to a predetermined threshold. In some embodiments, when the error correction capability of a BCH decoder is t, the error number is s, and s is smaller than t, the coefficients $\wedge_{s+1}$ to $\wedge_t$ of error locator polynomial are zero so that the calculations at the power control units involving coefficients $\wedge_{s+1}$ to $\wedge_t$ consume little power. Thus, even if all power control units are turned on to search the error locations, error location finding module 106 does not use high power. If the number of errors is greater than or equal to the predetermined threshold, in step 1014, a portion of the power control units 220 are turned on and the remainder of power control units 220 are turned off, depending on the available time to find error locations. For example, i power control units 220 in FIG. 2 are turned off, where $1 \leq i \leq p$, so that p minus i locations are searched at the same time. If the number of errors is not greater than or equal to the predetermined threshold, in step 1016, all power control units are turned on to search the error locations. For example, when all power control units 220 are turned on, p locations can be search at the same time. Following step 1006, 1010, 1014, or 1016, the method 1000 ends at step 1018.

Figure 11:
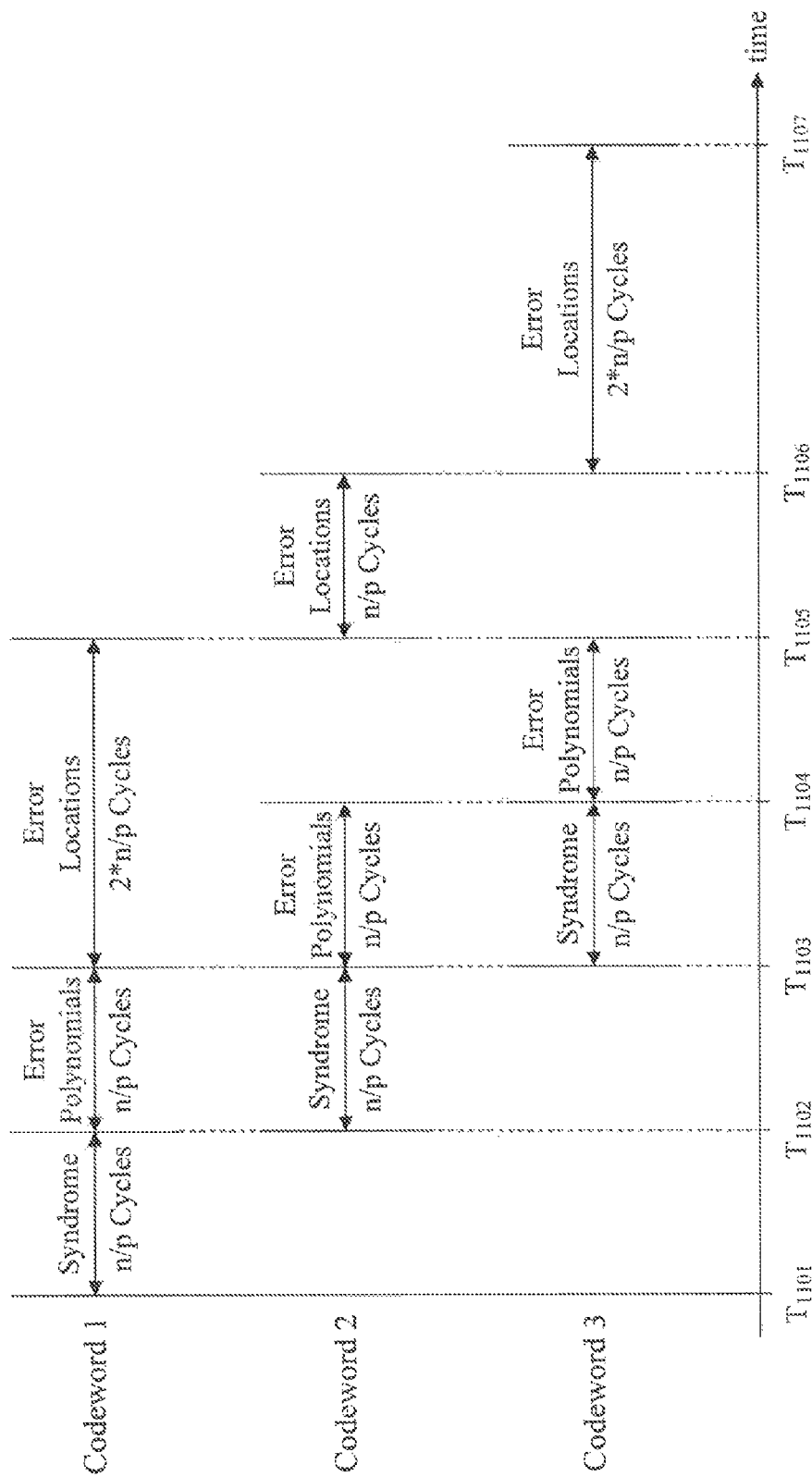
FIG. 11 is a timing diagram showing timings of codewords processed in a BCH decoder consistent with embodiments of the present disclosure.

FIG. 11 is a timing diagram showing timings of three Codewords 1, 2, and 3 processed in BCH decoder 100, in which Codewords 1 and 3 include errors greater than or equal to the predetermined threshold and Codeword 2 includes errors less than the predetermined threshold. Referring to FIGS. 1, 2, and 11, at time $T_{1101}$, Codeword 1 having n bits is received at BCH decoder 100. From time $T_{1101}$ to time $T_{1102}$, Codeword 1 is processed by syndromes computing module 102, which can be configured to use n/p clock cycles to compute syndromes for Codeword 1. From time $T_{1102}$ to time $T_{1103}$, Codeword 1 is processed by polynomials generating module 104, which uses n/p clock cycles to generate polynomials for Codeword 1; and Codeword 2 having n bits is processed by syndromes computing module 102, which uses n/p clock cycles to compute syndromes for Codeword 2. From time $T_{1103}$ to time $T_{1105}$, because Codeword 1 includes errors greater than the predetermined threshold, as explained in steps 1012 and 1014 in FIG. 10, Codeword 1 is processed by error location finding module 106, which uses one half (p/2) of power control units 220 to find the error locations in Codeword 1, resulting in using 2*n/p clock cycles.

From time $T_{1103}$ to time $T_{1104}$, Codeword 2 is processed by polynomials generating module 104, which uses n/p clock cycles to generate polynomials for Codeword 2; and Codeword 3 having n bits is processed by syndromes computing module 102, which uses n/p clock cycles to compute syndromes for Codeword 3. From time $T_{1104}$ to time $T_{1105}$, Codeword 3 is processed by polynomials generating module 104, which uses n/p clock cycles to generate polynomials for Codeword 3.

After error location finding module 106 is freed from processing Codeword 1, from time $T_{1105}$ to time $T_{1106}$, Codeword 2 is processed by error location finding module 106. Because the number of errors in Codeword 2 is not greater than or equal to the predetermined threshold, error location finding module 106 uses all (p) power control units 220 to find the error locations in Codeword 2, as explained in step 1016 in FIG. 10, resulting in using n/p clock cycles. After error location finding module 106 is freed from processing Codeword 2, from time $T_{1106}$ to time $T_{1107}$, because Codeword 3 includes errors greater than the predetermined threshold, as explained in steps 1012 and 1014 in FIG. 10, Codeword 3 is processed by error location finding module 106, which uses 2*n/p clock cycles to find error locations in Codeword 3. The total time used to process three codewords is 7*n/p clock cycles. The processing time shown in FIG. 11 is shorter than the 8*n/p clock cycles in FIG. 7.

The decoders and methods explained in this disclosure can employ not only BCH codes but other codes, such as Reed Solomon codes, to find error locations.

Although BCH decoders are provided in the present disclosure to find error location, the present disclosure is not so limited. Embodiments consistent with the present disclosure can be applied to other types of decoders that are used to find error locations in a codeword.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An electronic device for finding error locations in a codeword, comprising:

a plurality of power control units configured to find error locations in the codeword; and a controller configured to control the plurality of power control units, wherein:

the plurality of power control units are coupled in parallel;

each of the plurality of power control units includes a plurality of corresponding input control circuits to individually turn on or off the corresponding power control unit; and the controller turns off a first number of the power control units by disabling the corresponding ones of the input control circuits when the electronic device is operated in a power-saving mode.

2. The electronic device according to claim 1, wherein: the controller turns off all of the power control units when the codeword is determined to include no error.

3. The electronic device according to claim 1, wherein the controller turns on all of the power control units or turns off a second number of the power control units when the electronic device is operated in a time-saving mode, wherein the first number is greater than the second number.

4. The electronic device according to claim 1, wherein the plurality of power control units include:

a first power control unit including first input control circuits, first multiplexers, registers, second multiplexers, and a first adder, wherein each of the first multiplexers includes a first input port coupled to an output of a corresponding one of the first control circuits and a second input port coupled to a corresponding one of the registers, and an output of each of the first multiplexers is coupled to the first adder.

5. The electronic device according to claim 4, wherein the plurality of power control units include:

one or more second power control units coupled in parallel with the first power control unit, each of the second power control units including second input control circuits, first calculation circuits, and a second adder, wherein each of the second input control circuits has an input coupled to an output of one of the first multiplexers and an output coupled to one of the first calculation units, and each of the first calculation units includes a first output port coupled to the corresponding second adder and a second output port coupled to an input of a corresponding one of the second multiplexers of the first power control unit.

6. The electronic device according to claim 5, wherein the plurality of power control units further include:

a third power control unit coupled in parallel with the first power control unit and the one or more second power control units, the third power control unit including third input control circuits and second calculation circuits, wherein each of the third input control circuits has an input coupled to the output of one of the first multiplexers and an output coupled to a corresponding one of the second calculation units, and each of the second calculation units includes an output port coupled to an input of a corresponding one of the second multiplexers of the first power control unit.

7. The electronic device according to claim 6, wherein the third power control unit includes t third input control circuits and t second calculation circuits, wherein t is an error correction capability of the electronic device.

8. The electronic device according to claim 6, wherein each of the first adder and the second adder is coupled to an output control circuit, the output control circuit being configured to reduce leakage current from the first power control unit or the one or more second power control units.

9. The electronic device according to claim 8, wherein the controller is configured to provide a same control signal to the first input control circuits and the output control circuit of the first power control unit.

10. The electronic device according to claim 8, wherein the controller is configured to provide a same control signal to the second input control circuits and the output control circuit of the one or more second power control units.

11. The electronic device according to claim 8, wherein the first input control circuits, the second input control circuits, and the third input control circuits each include at least one of a power switch circuit or a combinational logic circuit.

12. The electronic device according to claim 11, wherein the combinational logic circuit includes at least one of a multiplexer, an AND gate, an OR gate, a NAND gate, an XOR gate, an XNOR gate, or a NOR gate.

13. The electronic device according to claim 8, wherein the output control circuit includes at least one of an isolation circuit or a combinational logic circuit.

14. The electronic device according to claim 13, wherein the combinational logic circuit includes at least one of a multiplexer, an AND gate, an OR gate, a NAND gate, an XOR gate, an XNOR gate, or a NOR gate.

15. The electronic device according to claim 5, wherein:

the first power control unit includes t first input control circuits, t first multiplexers, t registers, and t second multiplexers; and each of the second power control units includes t second input control circuits, t first calculation circuits;

wherein t is an error correction capability of the electronic device.

16. The electronic device according to claim 5, wherein each of the first adder and the second adder performs an XOR operation on received bits with no carry.

17. A method for finding error locations in a codeword, the method performed by an electronic device including a controller and a plurality of power control units, the method comprising:

determining whether the codeword includes one or more errors;

if the codeword includes no error, turning off all of the power control units by disabling input control circuits included in each of the power control units;

if the codeword includes one or more errors, determining whether a time to find locations of the one or more errors is shorter than or equal to a predetermined time;

if the time is shorter than or equal to the predetermined time, turning on all of the power control units; and if the time is not shorter than or equal to the predetermined time, turning off a portion of the power control units.

18. A method for finding error locations in a codeword, the method performed by an electronic device including a controller and a plurality of power control units, the method comprising:

determining whether the codeword includes one or more errors;

if the codeword includes no error, turning off all of the power control units by disabling input control circuits included in each of the power control units;

if the codeword includes one or more errors, determining whether a time to find locations of the one or more errors is shorter than or equal to a predetermined time;

if the time is shorter than or equal to the predetermined time, turning on all of the power control units;

if the time is not shorter than or equal to the predetermined time, determining whether the number of the errors in the codeword is greater than or equal to a predetermined threshold;

if the number of the errors in the codeword is not greater than or equal to the predetermined threshold, turning on all of the power control units; and If the number of the errors in the codeword is greater than or equal to the predetermined threshold, turning off a portion of the power control units.

* * * * *